(12) United States Patent
Hashimoto et al.

(10) Patent No.: US 8,687,824 B2
(45) Date of Patent: Apr. 1, 2014

(54) ACOUSTIC PROCESSING DEVICE

(75) Inventors: Takeshi Hashimoto, Motomiya (JP); Toru Hikichi, Koriyama (JP)

(73) Assignee: Clarion Co., Ltd., Saitama-Shi (JP)

( * ) Notice: Subject to any disclaimer, the term of this patent is extended or adjusted under 35 U.S.C. 154(b) by 616 days.

(21) Appl. No.: 12/995,466

(22) PCT Filed: Jul. 8, 2009

(86) PCT No.: PCT/JP2009/062467
§ 371 (c)(1),
(2), (4) Date: Dec. 1, 2010

(87) PCT Pub. No.: WO2010/005034
PCT Pub. Date: Jan. 14, 2010

(65) Prior Publication Data
US 2011/0085681 A1    Apr. 14, 2011

(30) Foreign Application Priority Data
Jul. 11, 2008    (JP) .................................. 2008-180902

(51) Int. Cl.
*H03G 3/00*    (2006.01)

(52) U.S. Cl.
USPC ...................................................... 381/107

(58) Field of Classification Search
USPC .............. 381/56–59, 102–104, 107; 704/205, 704/225
See application file for complete search history.

(56) References Cited

U.S. PATENT DOCUMENTS

| | | | | |
|---|---|---|---|---|
| 5,210,796 | A * | 5/1993 | Hirabayashi et al. ............ | 381/12 |
| 2004/0059570 | A1 * | 3/2004 | Mochinaga et al. .......... | 704/205 |
| 2008/0015851 | A1 * | 1/2008 | Yamada ........................ | 704/225 |

FOREIGN PATENT DOCUMENTS

| | | |
|---|---|---|
| CN | 1494054 | 5/2004 |
| CN | 1961479 | 5/2007 |
| JP | 56-158511 | 12/1981 |
| JP | 59-84940 U | 6/1984 |
| JP | 2007-228336 | 9/2007 |

OTHER PUBLICATIONS

Robert et al., "A Single—Chip Three—Channel 112 dB Audio DAC with Audio DSP Capability", Audio Engineering Society, Convention Paper 5475, 111th Convention, Sep. 21-Sep. 24, 2001, New York, NY, USA.*
Supplementary European Search Report of Application No. EP09794478.9, Feb. 14, 2013.
Robert et al., "A Single—Chip Three—Channel 112 dB Audio DAC with Audio DSP Capability", Audio Engineering Society, Convention Paper 5475, 111th Convention, Sep. 21, 2001-Sep. 24, 2001, New York, NY, USA.
Chinese Office Action for corresponding CN Application No. 200980124611.4, Mar. 22, 2013.
International Search Report for International Application No. PCT/JP2009/062467, Oct. 13, 2009.

* cited by examiner

*Primary Examiner* — Lun-See Lao
(74) *Attorney, Agent, or Firm* — Ditthavong Mori & Steiner, P.C.

(57) ABSTRACT

There is provided an acoustic processing device capable of maintaining volume and reproducing audio signals with good sound quality independent of the media audio encoding format, sound source type or sound source volume setting. In the acoustic processing device (1), a limiter control signal generation section (5) generates a limiter control signal for applying rapid variation correction determined based on a short-term signal level variation of an audio signal of a sound source and slow variation correction determined based on a long-term signal level variation of the audio signal of the sound source, and volume control sections (7) and (8) apply the generated limiter control signal to the audio signal and control the volume of the sound source.

2 Claims, 15 Drawing Sheets

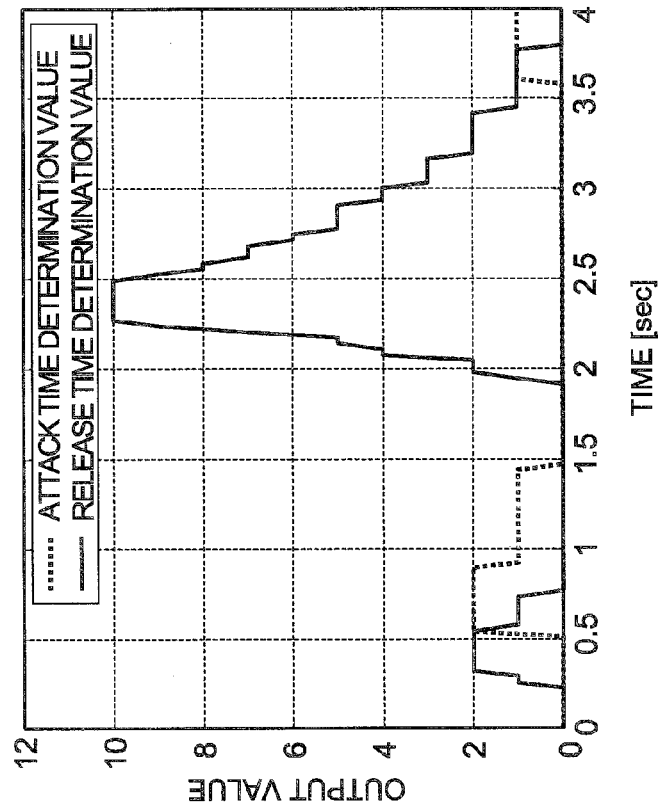
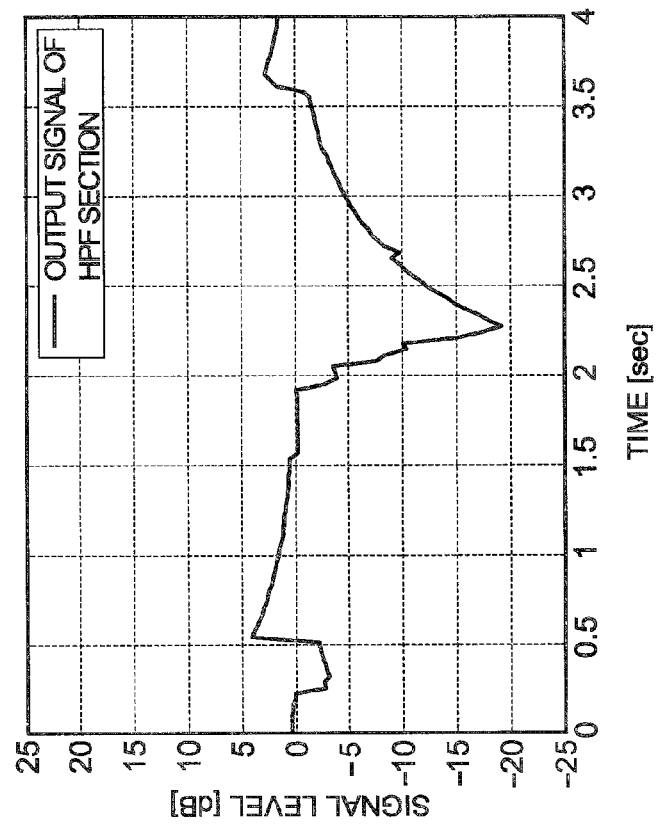
FIG.6(b)
FIG.6(a)

ACOUSTIC PROCESSING DEVICE

TECHNICAL FIELD

The present invention relates to an acoustic processing device and, more particularly, to an acoustic processing device capable of performing rapid variation correction and slow variation correction for the signal level of an audio signal from a sound source.

BACKGROUND ART

Today, we can enjoy music recorded in various recording formats (i.e., music recorded from various sources). Such music includes, e.g., music based on an analog sound source such as AM or FM radio, music based on a digital sound source such as CD or DVD, and the like.

A typical audio device includes an operation section (selector or touch panel) for selecting various sources. A listener operates the operation section to select one of the sources so as to reproduce his or her favorite music (refer to Patent Document 1).

CITATION LIST

Patent Literature

Patent Literature 1: JP-A-2007-228336 (pages 3 and 4, FIG. 2)

SUMMARY OF INVENTION

Technical Problem

However, an audio encoding format of music recorded in a medium such as CD or DVD differs depending on the medium to be used. For example, an audio encoding format adopted for CD is a linear PCM (Pulse Code Modulation), and audio encoding format adopted for a DVD is an AC-3 (Audio Code number 3) or DTS (Digital Theater System). Generally, in the linear PCM, music is recorded at comparatively high volume. In the AC-3 or DTS, music is recorded at low volume as a whole in order to ensure wide dynamic range. Thus, when a listener changes the type of the medium from which music is reproduced (i.e., source of music), e.g., from CD to DVD or from DVD to CD, he or she needs to control the volume of an audio device for a desired volume.

In the case where the category of music or video to be recorded is changed, e.g., between action movie and classical movie or between rock music and classical music even though a medium to be used for recording is not changed, the volume of recorded music is changed depending on the category. Therefore, every time the category is changed, a listener needs to control the volume of an audio device for a desired volume even the type of the medium to be used is not changed.

Further, music (voice) broadcasted through an AM radio tuner, music (voice) broadcasted through an FM radio tuner, music (voice) broadcasted through an analog TV tuner, or music (voice) broadcasted through a digital TV tuner differs in volume setting for each broadcasting company. Therefore, every time the reception channel is switched, a listener needs to control the volume of an audio device.

In recent years, many people enjoy listening music output from a portable audio player capable of storing thousands of music data using a headphone, etc. Thus, for example, a case can be assumed where music recorded in the portable audio player is reproduced using an on-vehicle audio apparatus through an external input terminal, etc. at the time of driving a vehicle. In the case where music is reproduced in such a manner, both a volume control function in the portable audio player and a volume control function in the on-vehicle audio apparatus need to be taken into consideration in the volume control operation, requiring volume control a plurality of times for a desired volume.

The present invention has been made in view of the above problems, and an object thereof is to provide an acoustic processing device capable of maintaining volume and reproducing audio signals with good sound quality independent of the media audio encoding format, sound source type or sound source volume setting.

Solution to Problem

To solve the above problem, according to the present invention, there is provided an acoustic processing device includes: a level signal generation section that generates a first variation signal representing a short-term signal level variation of an audio signal input from a sound source and a second variation signal representing a long-term signal level variation of the audio signal; a first control signal generation section that generates, based on the signal level variation in the first variation signal, a first control signal for performing rapid variation correction for the signal level of the audio signal; a second control signal generation section that generates, based on the signal level variation in the second variation signal, a second control signal for performing slow variation correction for the signal level of the audio signal; a limiter control signal generation section that adds the second control signal generated by the second control signal generation section to the first control signal generated by the first control signal generation section to generate a limiter control signal capable of adding the rapid variation correction and slow variation correction to the signal level of the audio signal; and a volume control section that performs volume control of the audio signal by applying the limiter control signal to the audio signal.

In the acoustic processing device according to the present invention, the level signal generation section generates a first variation signal representing a short-term signal level variation of an audio signal input from a sound source and a second variation signal representing a long-term signal level variation of the audio signal input from a sound source. The generation of the first and second variation signals allows a signal level variation of the audio signal to be determined both on a long-term standpoint and a short-term standpoint.

Thus, when the first control signal generation section generates a first control signal based on the first variation signal and applies the generated first control signal to the audio signal, it is possible to achieve rapid variation correction for the signal level of the audio signal. Similarly, when the second control signal generation section generates a second control signal based on the second variation signal and applies the generated second control signal to the audio signal, it is possible to achieve slow variation correction for the signal level of the audio signal.

Further, in the acoustic processing device according to the present invention, the limiter control signal generation section adds the second control signal for slow variation correction to the first control signal for rapid variation correction to generate a limiter control signal. The generated limiter control signal is applied to the audio signal of a sound source by the volume control section. This simplifies a configuration of the acoustic processing device as compared to a case where the first and second control signals are individually applied to the audio signal of a sound source and allows a simplification of signal processing and a reduction in processing load.

In particular, when the acoustic processing is applied to an audio signal, linear-to-decibel conversion or sampling rate conversion is applied for each control signal to be subjected to the acoustic processing and then the acoustic processing is applied to the audio signal. Therefore, by generating one control signal based on the first and second control signals and applying the acoustic processing to the audio signal using the one control signal in a single processing step, a simplification of signal processing and a reduction in processing load can be achieved more effectively.

Further, in the acoustic processing device, wherein the second control signal generation section may include: a correction time information setting section that sets information concerning correction time for performing the variation correction based on a variation state of the signal level of the second variation signal; and a dynamic range signal generation section that calculates correction time based on information concerning the correction time and generates the second control signal capable of performing variation correction for the audio signal at a response speed corresponding to the calculated correction time.

As described above, the second variation signal is a signal representing a long-term signal level variation of an audio signal. Thus, the second control signal generation section can generate a signal for performing slower variation correction by calculating the second control signal based on the second variation signal. However, if the slow variation correction is performed without modification in the case where the signal level of the second variation signal is abruptly changed (increased or decreased), the variation correction may be insufficient for the variation state of the signal level. In order to cope with this, the correction time information setting section determines the variation state of the second variation signal, more particularly, abrupt increase or decrease of the signal level and sets information concerning the correction time for performing variation correction based on the determined variation state. Further, the dynamic range signal generation section calculates the correction time from information concerning the preset correction time and generates a second control signal for performing variation correction for the audio signal at a response speed corresponding to the calculated correction time. The generation of the second control signal allows the response time of the variation correction to be flexibly varied in association with the signal level variation of a sound source.

Further, in the acoustic processing device, wherein the correction time information setting section may set information for reducing the correction time in the case where the signal level of the second variation signal is abruptly changed and may set information for increasing the correction time in the case where the signal level of the second variation signal is slowly changed.

As described above, the correction time information setting section sets information for reducing the correction time in the case where the signal level of the second variation signal is abruptly changed so as to flexibly vary the response time of the variation correction in association with the signal level variation of a sound source. This setting can increase the response speed of the variation correction to thereby achieve rapid correction. In the case where the signal level of the second variation signal is slowly changed, it is not always necessary to perform the rapid correction processing. Thus, the correction time information setting section sets information for increasing the correction time to reduce the response speed of the variation correction to thereby achieve slow correction processing.

Advantageous Effects of Invention

According to the acoustic processing device of the present invention, rapid variation correction determined based on a short-term signal level variation of an audio signal of a sound source and slow variation correction determined based on a long-term signal level variation of the audio signal of the sound source can be applied to the audio signal by using a limiter control signal. This allows a signal level variation of the audio signal to be determined both on a long-term standpoint and a short-term standpoint, whereby volume control guaranteeing both the rapid variation correction and slow variation correction for the audio signal can be achieved.

BRIEF DESCRIPTION OF THE DRAWINGS

FIG. 3($b$) is a view illustrating time variations of a second maximum value detection signal and a second maximum value holding signal.

FIG. 5($b$) is a view illustrating a variation state of an attack time determination value and variation state of a release time determination value in the same case.

FIG. 6($a$) is a view illustrating a signal level variation state of an output signal of the HPF section as in the case where a sound source of an input audio signal is switched to another sound source and the volume is abruptly decreased by 20 dB or more; and FIG. 6($b$) is a view illustrating a variation state of an attack time determination value and variation state of a release time determination value in the same case.

FIG. 7($b$) is a view illustrating a variation state of an attack time determination value and variation state of a release time determination value in the same case.

FIG. 10($b$)

is a view illustrating level conversion characteristics in a lookup table section of a limiter control section according to the present embodiment.

Figure 11:
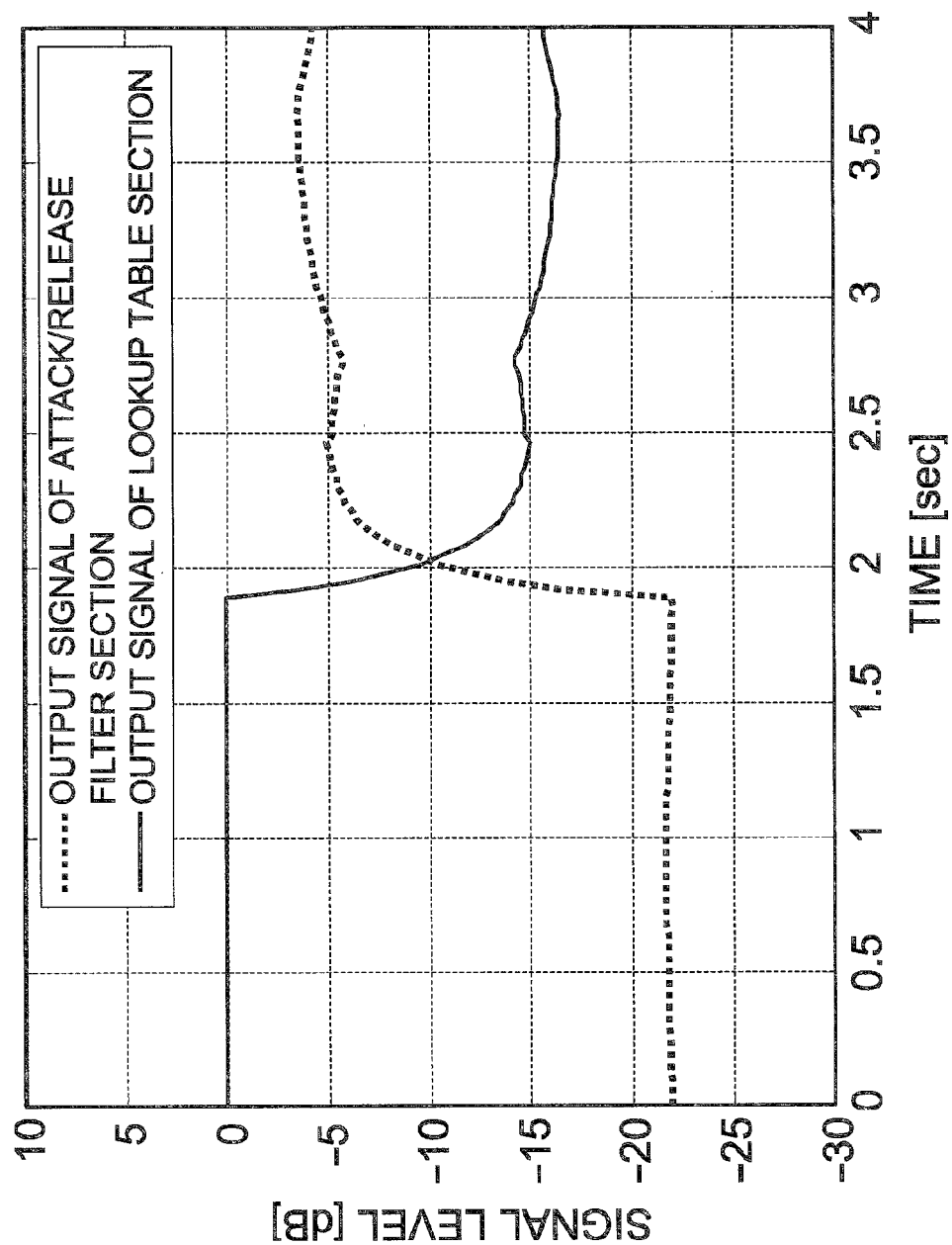

FIG. 11 is a view illustrating output signals of an attack/release filter section and a lookup table section of the dynamic range control section according to the present embodiment in the case where the volume of a sound source is abruptly increased.

Figure 12:
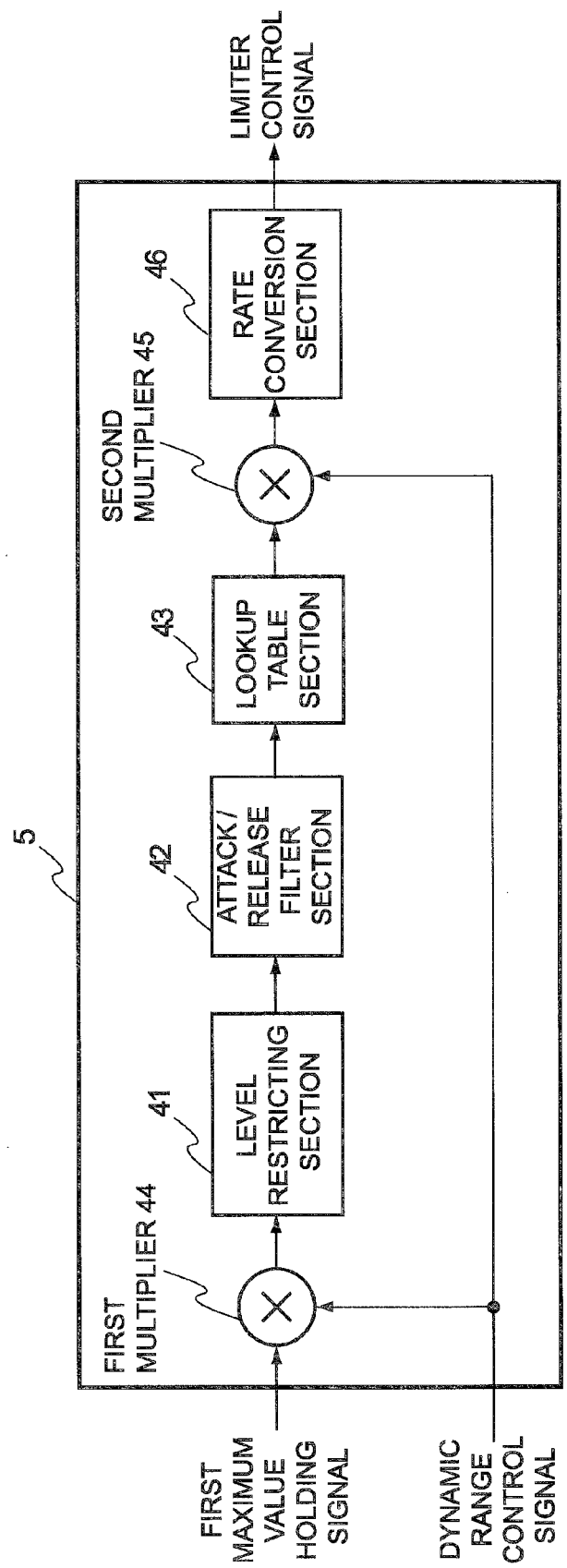

FIG. 12 is a block diagram schematically illustrating a configuration of a limiter control section according to the present embodiment.

Figure 13:
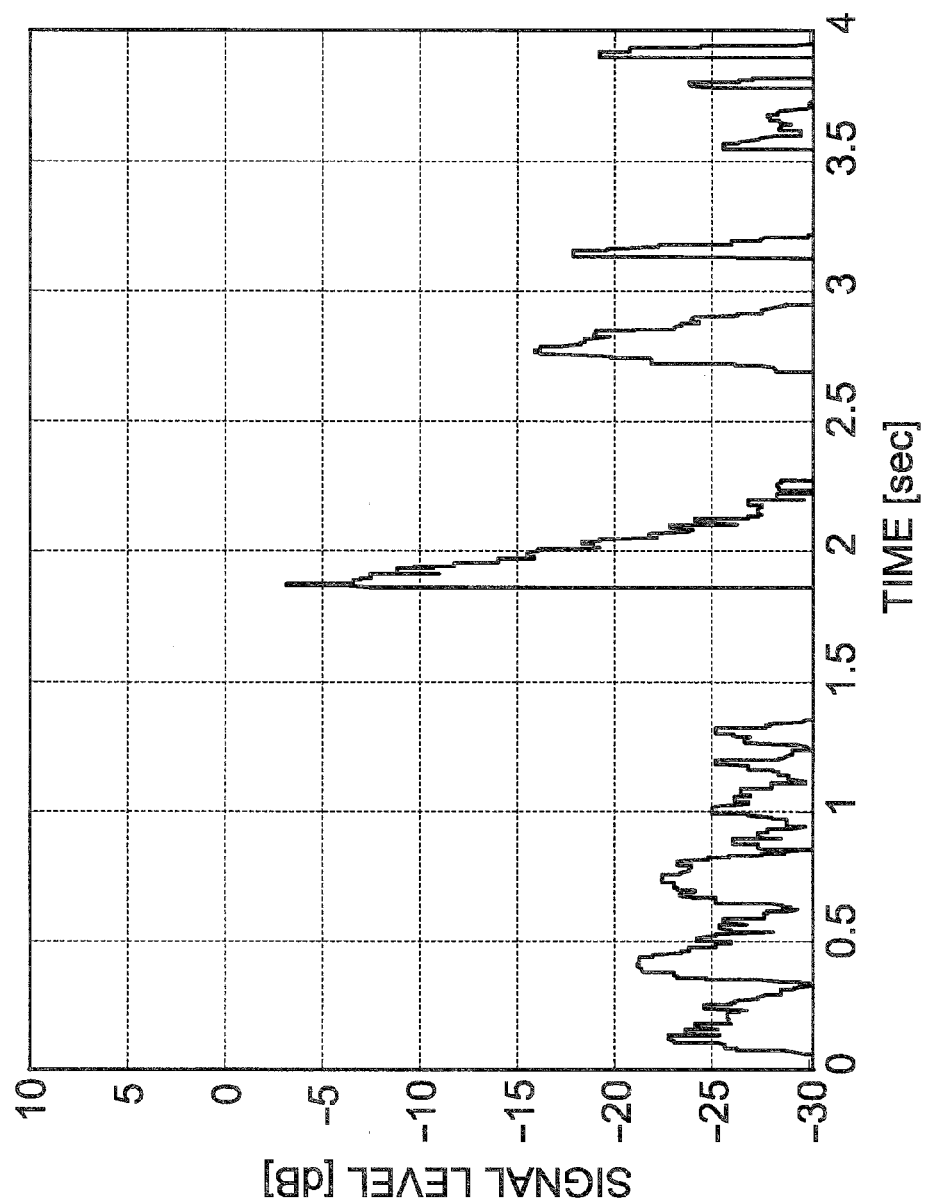

FIG. 13 is a view illustrating a time variation of an output signal of a first multiplier in the case where the volume of a sound source is abruptly increased by 20 dB or more.

Figure 14:
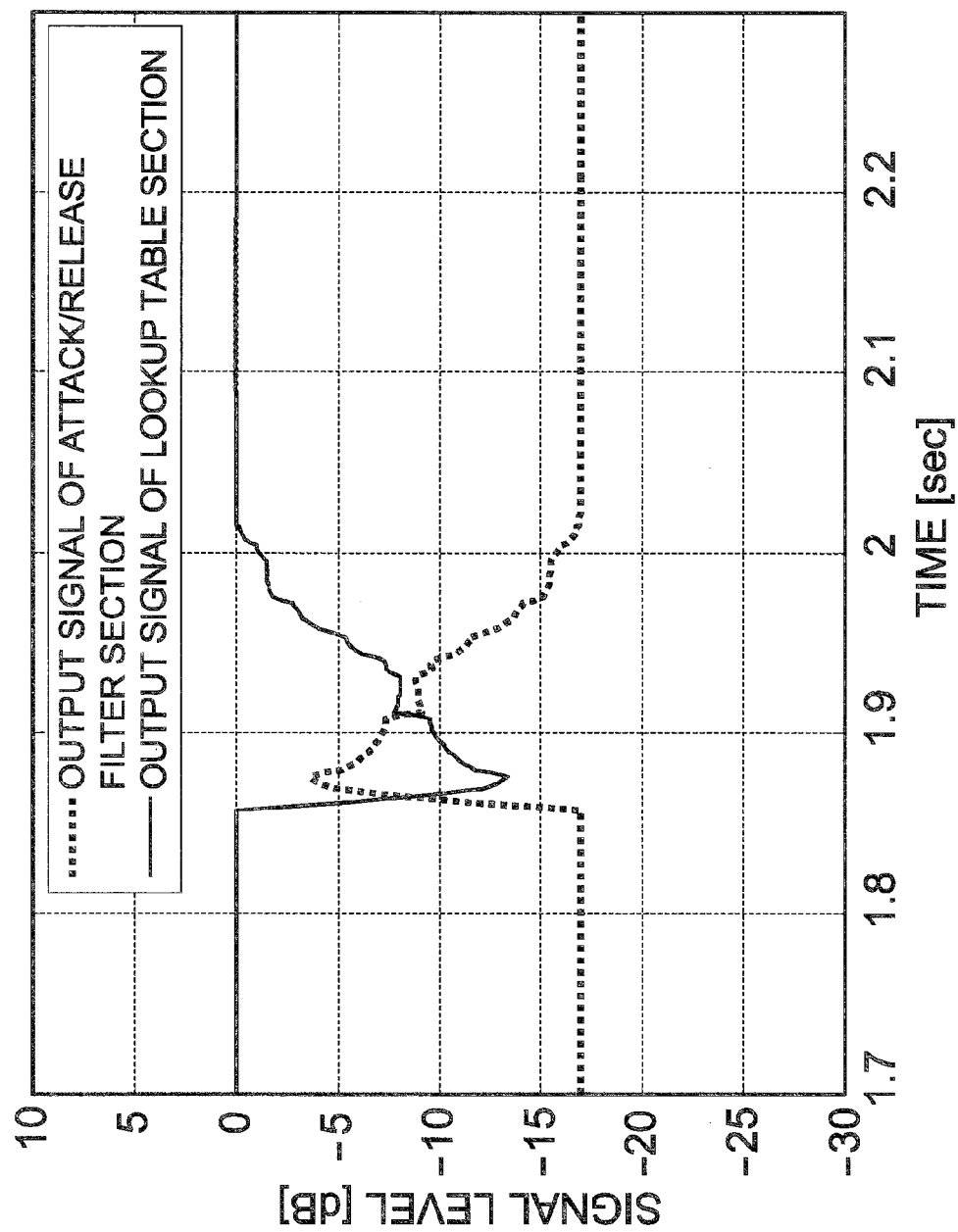

FIG. 14 is a view illustrating output signals of an attack/release filter section and a lookup table section of the limiter control section according to the present embodiment in the case where the volume of a sound source is abruptly increased by 20 dB or more.

Figures 15A, 15B:
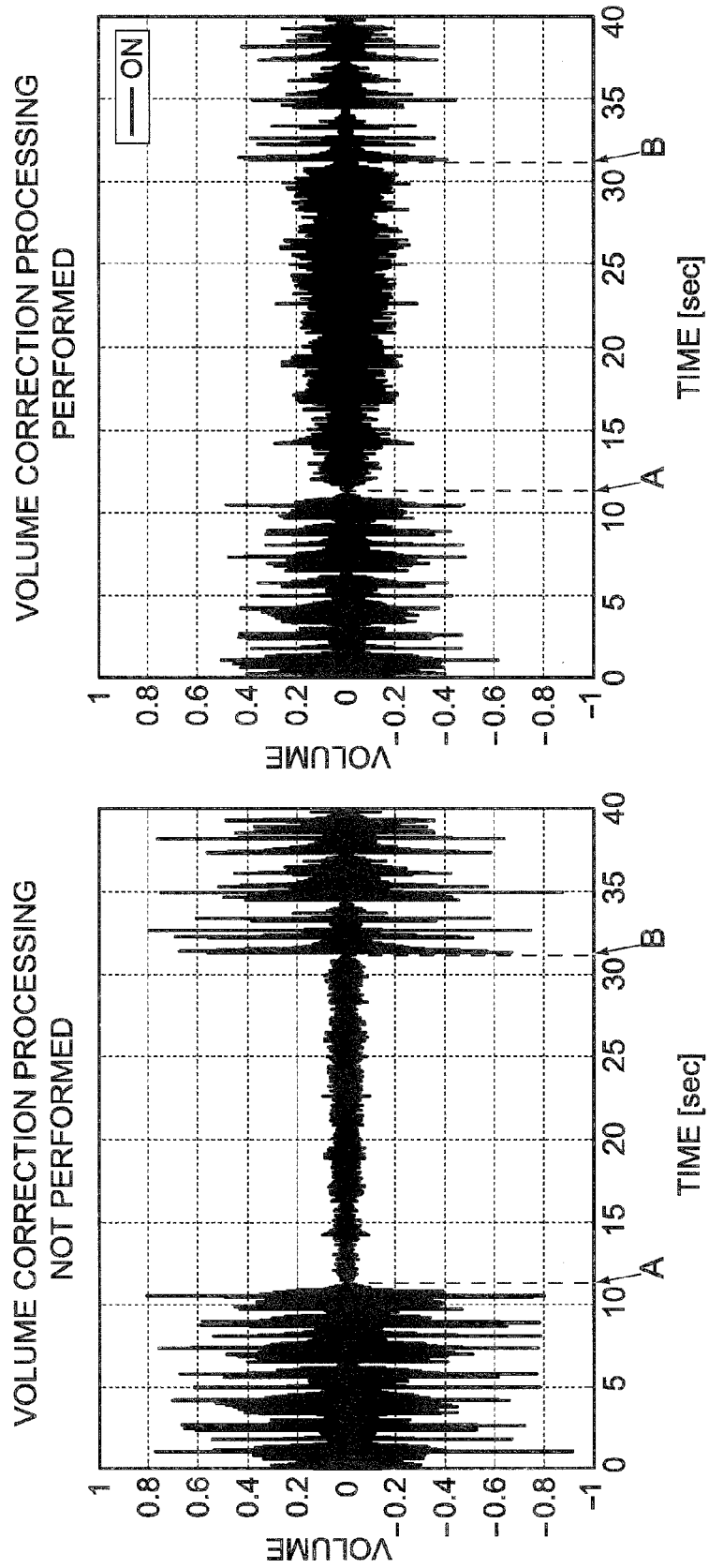

FIG. 15(a) is a view illustrating a variation state of the volume of a sound source in the case where the volume control in the acoustic processing device according to the present embodiment is not performed; and FIG. 15(b) is a view illustrating a variation state of the volume of a sound source in the case where the volume control in the acoustic processing device according to the present embodiment is performed.

DESCRIPTION OF EMBODIMENTS

An acoustic processing device according to the present invention will be described in detail with reference to the drawings.

Figure 1:
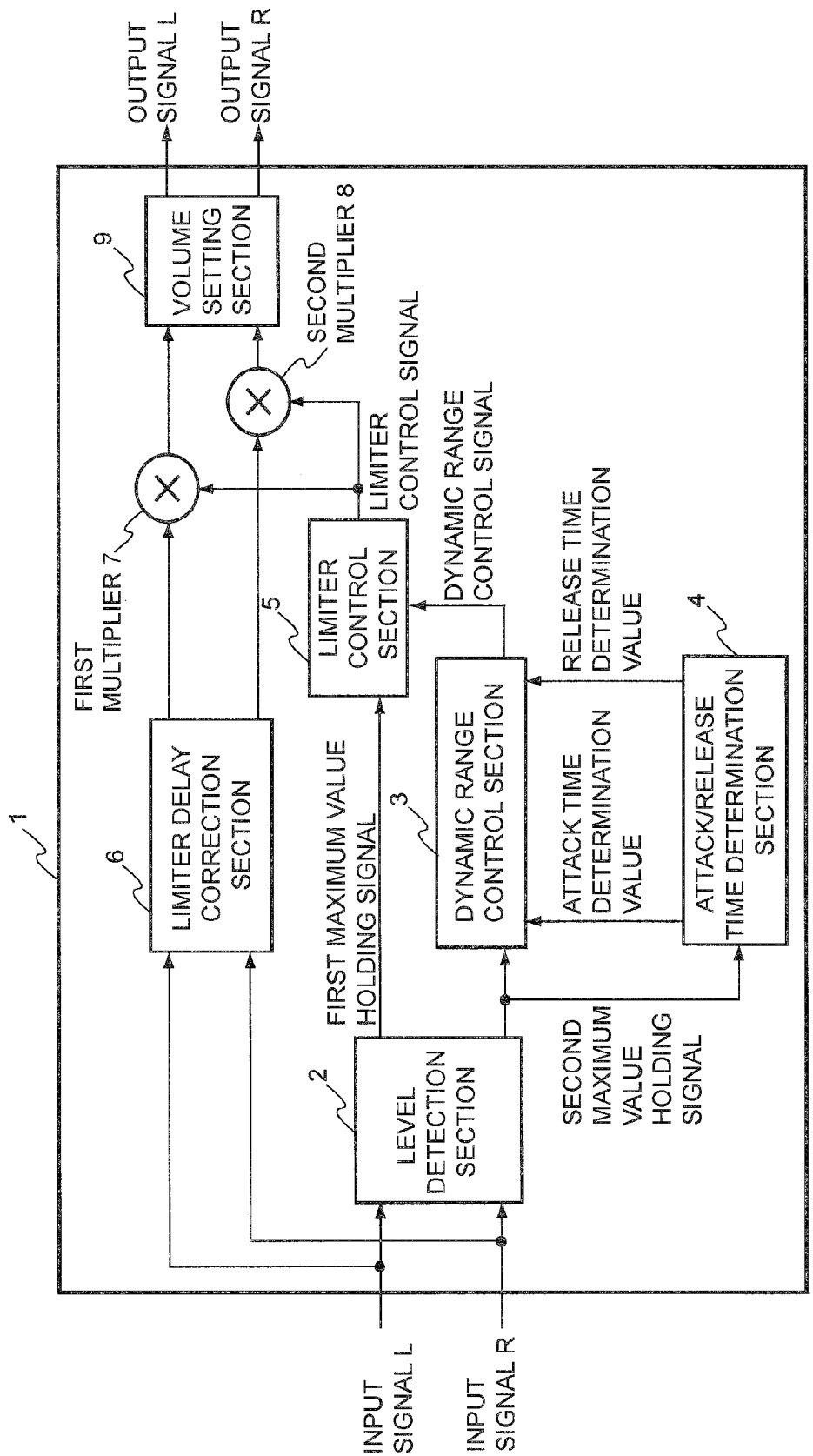
FIG. 1 is a block diagram schematically illustrating a configuration of an acoustic processing device according to an embodiment of the present invention.

FIG. 1 is a block diagram schematically illustrating a configuration of the acoustic processing device. An acoustic processing device 1 receives two-channel input signals (input signal L and input signal R) from a not illustrated sound source. Output signals (output signal L and output signal R) that have been subjected to predetermined acoustic processing by functional sections of the acoustic processing device 1 are output to a not illustrated output device such as a speaker to enable a listener to listen the sound based on the output signals.

As illustrated in FIG. 1, the acoustic processing device 1 includes a level detection section (level signal generation section) 2, a dynamic range control section (second control signal generation section, dynamic range signal generation section) 3, an attack/release time determination section (second control signal generation section, correction time information setting section) 4, a limiter control section (first control signal generation section, limiter control signal generation section) 5, a limiter delay correction section 6, a first multiplier (volume control section) 7, a second multiplier (volume control section) 8, and a volume setting section 9.

[Volume Setting Section and Limiter Delay Correction Section]

The volume setting section 9 serves as a controller for setting/changing the signal level of a sound source and corresponds to, e.g., a volume controller in a general audio equipment. The limiter delay correction section 6 is provided for correcting a delay caused by acoustic processing performed in the limiter control section 5, etc. to be described later.

[Level Detection Section]

The level detection section 2 plays a role of generating a signal (first variation signal) indicative of a short-term variation of the maximum value in the signal level of a sound source and signal (second variation signal) indicative of a long-term variation of the maximum value in the signal level of a sound source.

Figure 2:
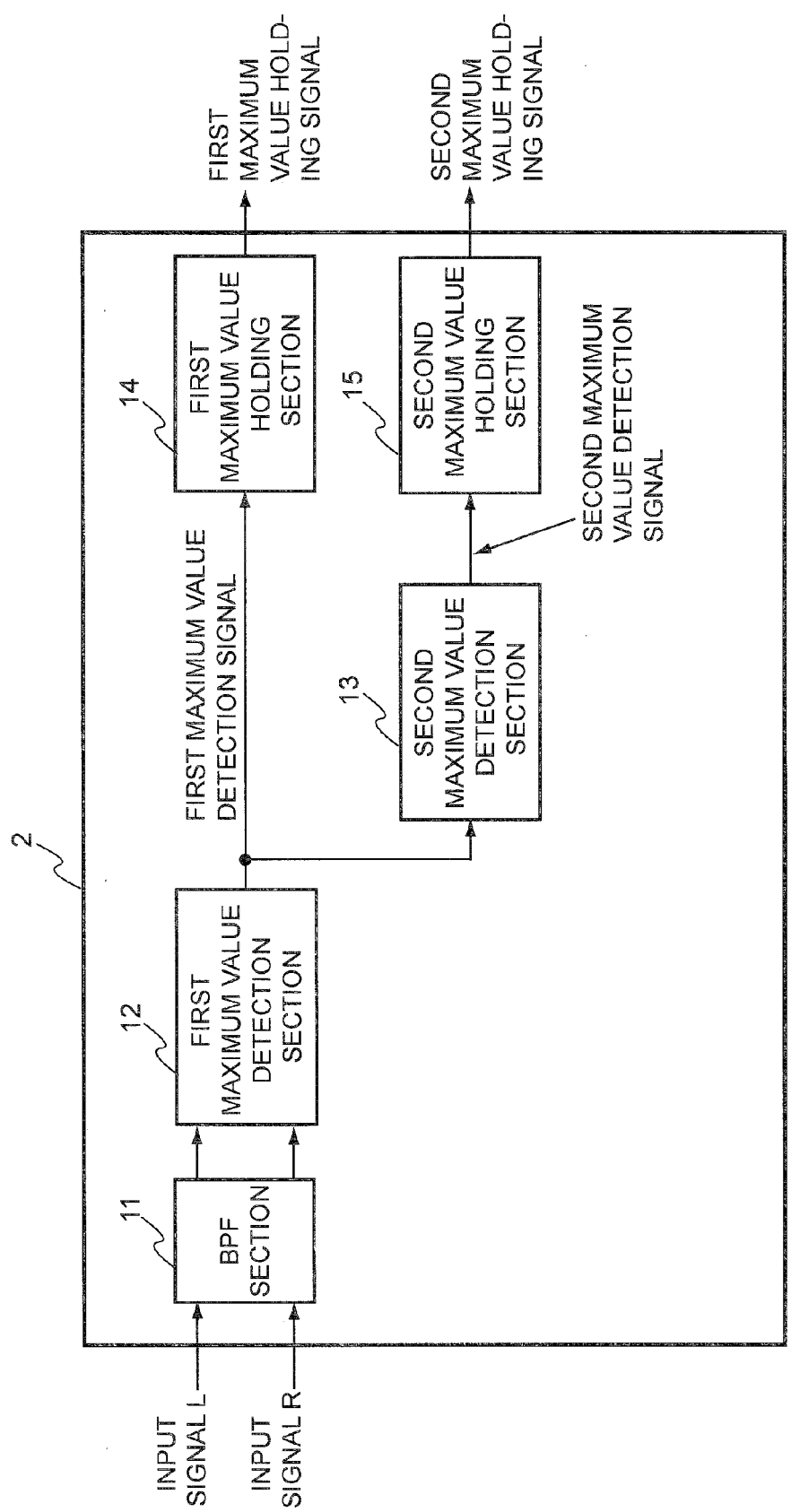
FIG. 2 is a block diagram schematically illustrating a configuration of a level detection section according to the present embodiment.

As illustrated in FIG. 2, the level detection section 2 includes a BPF (Band-pass filter) section 11, a first maximum value detection section 12, a second maximum value detection section 13, a first maximum value holding section 14, and a second maximum value holding section 15.

The BPF section 11 is a filter that allows passage of a signal of a predetermined band and has a role of allowing passage of only signals of a predetermined band in the input signals L and R. The BPF section 11 according to the present embodiment uses a band-pass filter of a secondary IIR (Infinite Impulse Response) filter type and a bandwidth of 50 Hz to 15 kHz is set.

The first maximum value detection section 12 calculates the absolute values of the input signals L and R that have been passed through the BPF section 11 and adds the two input signals. Further, the first maximum value detection section 12 detects the maximum values of the added signal at a predetermined time intervals. The first maximum value detection 12 according to the present embodiment performs the maximum value detection at a time interval of 2 msec.

Further, the first maximum value detection section 12 performs sampling rate conversion processing in accordance with the detection time. The first maximum value detection section 12 according to the present embodiment converts the sampling rate of the signal whose maximum value has been detected into 500 Hz (1/2 msec). As described above, the maximum value is detected at a predetermined time interval in the first maximum value detection section 12, and input signal that has been subjected to sampling rate conversion is output to the first maximum value holding section 14 and second maximum value detection section 13 as a first maximum value detection signal.

The second maximum value detection section 13 measures the first maximum value detection signal input from the first maximum value detection section 12 at a predetermined time interval to detect the maximum value. The second maximum value detection section 13 according to the present embodiment performs the maximum value detection at a time interval of 32 msec. As described above, the second maximum value detection section 13 sets the predetermined time interval (32 msec, in the present embodiment) longer than the predetermined time interval (2 msec, in the present embodiment) set in the first maximum value detection section 12.

Further, the second maximum value detection section 13 performs sampling rate conversion processing in accordance with the detection time. The second maximum value detection section 13 according to the present embodiment converts the sampling rate of the signal whose maximum value has been detected into 31.25 Hz (1/32 msec). As described above, the maximum value is detected at a predetermined time interval in the second maximum value detection section 13, and input signal that has been subjected to sampling rate conversion is output to the second maximum value holding section 15 as a second maximum value detection signal.

Figure 3B:
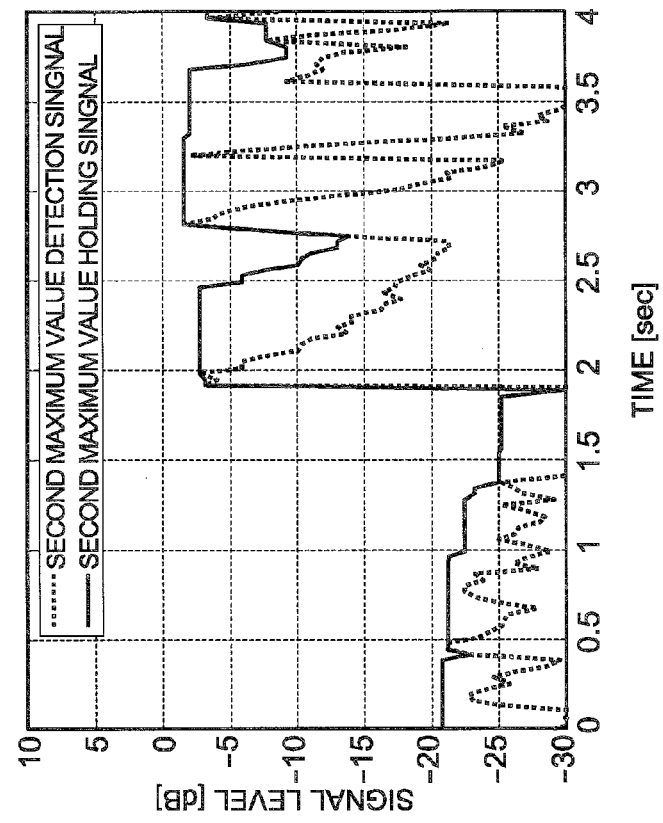
FIG. 3($a$) is a view illustrating time variations of a first maximum value detection signal and a first maximum value holding signal.
Figure 3A:
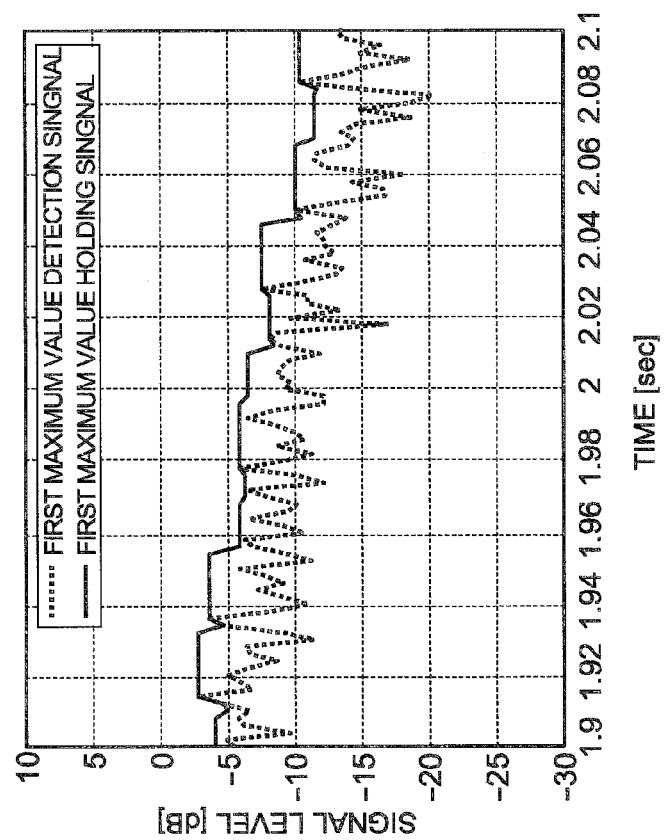

The first maximum value holding section 14 holds the value of the first maximum value detection signal input from the first maximum value detection section 12 only for a predetermined time period to generate a first maximum value holding signal (first variation signal). FIG. 3(a) is a view illustrating a comparison in a time variation of the signal level between the first maximum value detection signal input to the first maximum value holding section 14 and first maximum value holding signal subjected to the holding processing by the first maximum value holding section 14. In the example illustrated in FIG. 3(a), the first maximum value holding section 14 performs the holding processing of up to 20 msec as a holding time. The first maximum value holding signal generated by the first maximum value holding section 14 is output to the limiter control section 5.

The second maximum value holding section 15 holds the value of the second maximum value detection signal input from the second maximum value detection section 13 only for a predetermined time period to generate a second maximum value holding signal (second variation signal). FIG. 3(b) is a view illustrating a comparison in a time variation of the signal level between the second maximum value detection signal input to the second maximum value holding section 15 and second maximum value holding signal subjected to the holding processing by the second maximum value holding section 15. The scale of the time axis of FIG. 3(b) is larger than the scale of the time axis of FIG. 3(a). This is because that the detection interval (time interval) of the maximum value in the second maximum value detection signal is longer than the detection interval of the maximum value in the first maximum value detection signal.

In the example illustrated in FIG. 3(b), the second maximum value holding section 15 performs the holding processing of up to 512 msec as a holding time. The second maximum value holding signal generated by the second maximum value holding section 15 is output to the dynamic range control section 3 and attack/release time determination section 4.

The first maximum value holding signal generated in the first maximum value holding section 14 is held for a short period of time and therefore corresponds to a signal indicative of a short-term variation of the maximum value in an input sound source (input signal). On the other hand, the second maximum value holding signal generated in the second maximum value holding section 15 is held for a longer period of time than that during which the first maximum value holding signal is held in the first maximum value holding section 14 and therefore corresponds to a signal indicative of a long-term variation of the maximum value in an input sound source (input signal).

FIG. 3(b) illustrates the second maximum value detection signal and second maximum value holding signal in the case where a sound source of an input audio signal is switched to another sound source at time 1.9 sec and the volume is abruptly increased by 20 dB or more.

[Attack/release Time Determination Section]

The attack/release time determination section 4 has a role of setting an attack time determination value (information concerning correction time) and a release time determination value (information concerning correction time) based on a variation state (increase/decrease in the volume) of the volume in an input audio signal.

Figure 4:
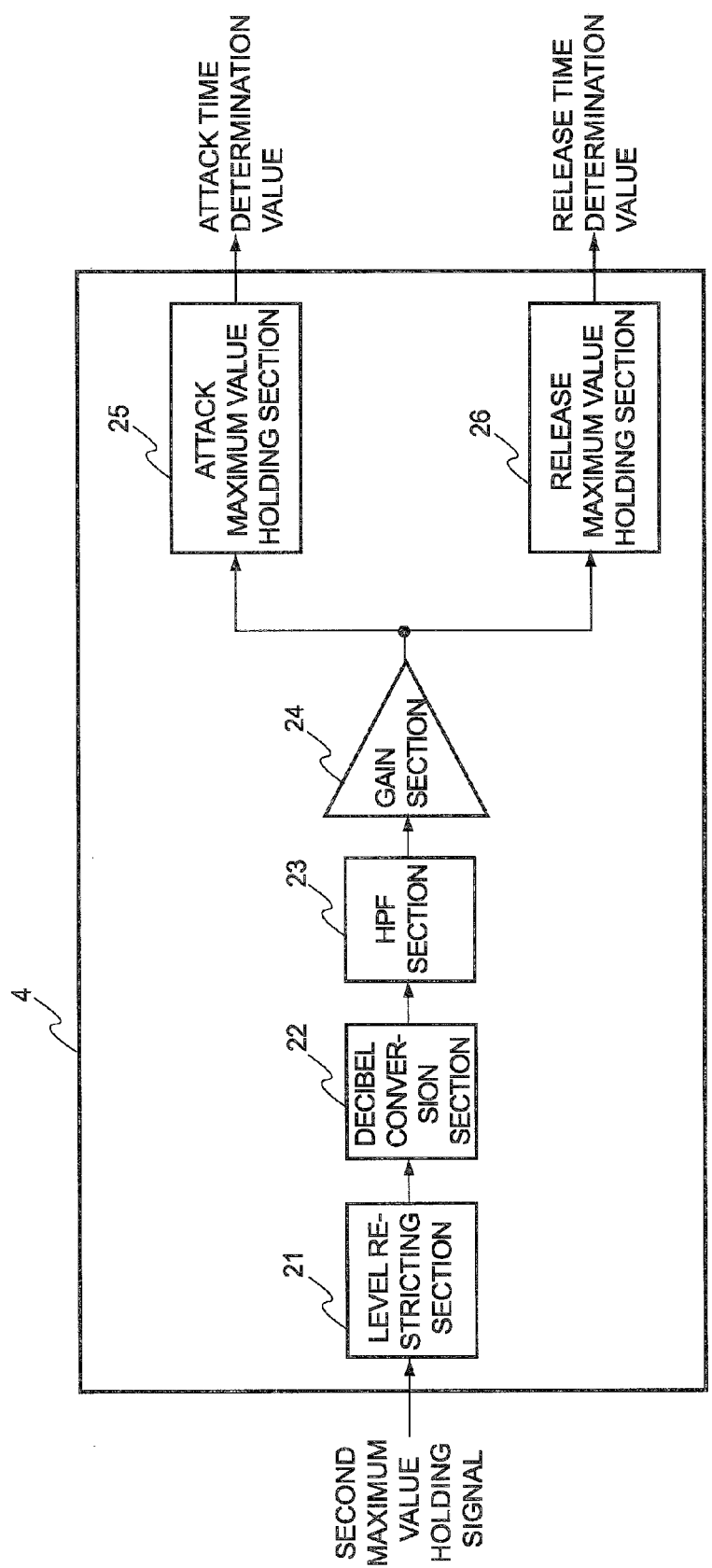
FIG. 4 is a block diagram schematically illustrating a configuration of an attack/release time determination section according to the present embodiment.

As illustrated in FIG. 4, the attack/release time determination section 4 includes a level restricting section 21, a decibel conversion section 22, an HPF section 23, a gain section 24, an attack maximum value holding section 25, and a release maximum value holding section 26.

The level restricting section 21 restricts the input level of the second maximum value holding signal. The decibel conversion section 22 converts a signal that has been subjected to input level restriction by the level restricting section 21 from a linear signal to a signal in a decibel scale. The HPF section 23 is a primary IIR type high-pass filter and differentiates the signal in a decibel scale to detect a signal variation.

The gain section 24 calculates a predetermined gain offset amount based on which the attack maximum value holding section 25 and release maximum value holding section 26 perform time determination so as to perform gain reduction processing. The attack maximum value holding section 25 holds a signal input from the gain section 24 that increases to the positive side, i.e., an attack signal for a predetermined time period to calculate an attack time determination value and outputs the calculated attack time determination value to the dynamic range control section 3. The release maximum value holding section 26 holds a signal input from the gain section 24 that increases to the negative side (i.e., decreases), i.e., a release signal for a predetermined time period to calculate a release time determination value and outputs the calculated release time determination value to the dynamic range control section 3.

Figure 5B:
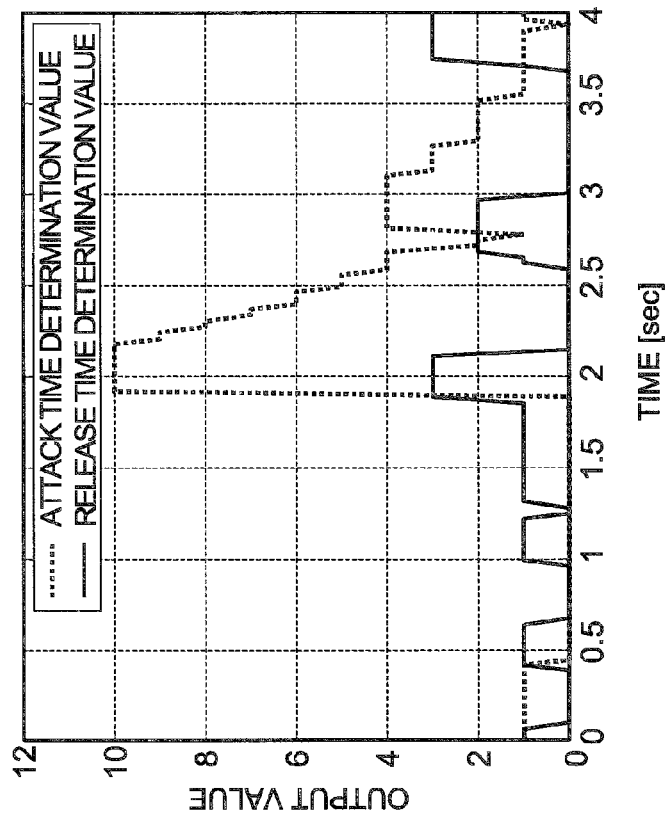
FIG. 5($a$) is a view illustrating a signal level variation state of an output signal of an HPF section as in the case where a sound source of an input audio signal is switched to another sound source and the volume is abruptly increased by 20 dB or more.
Figure 5A:
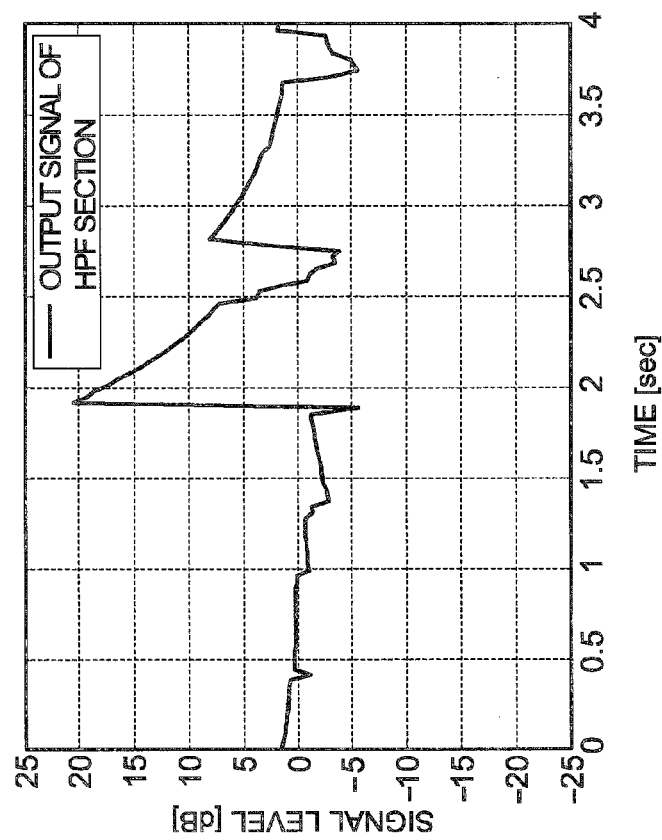
Figures 7A, 7B:
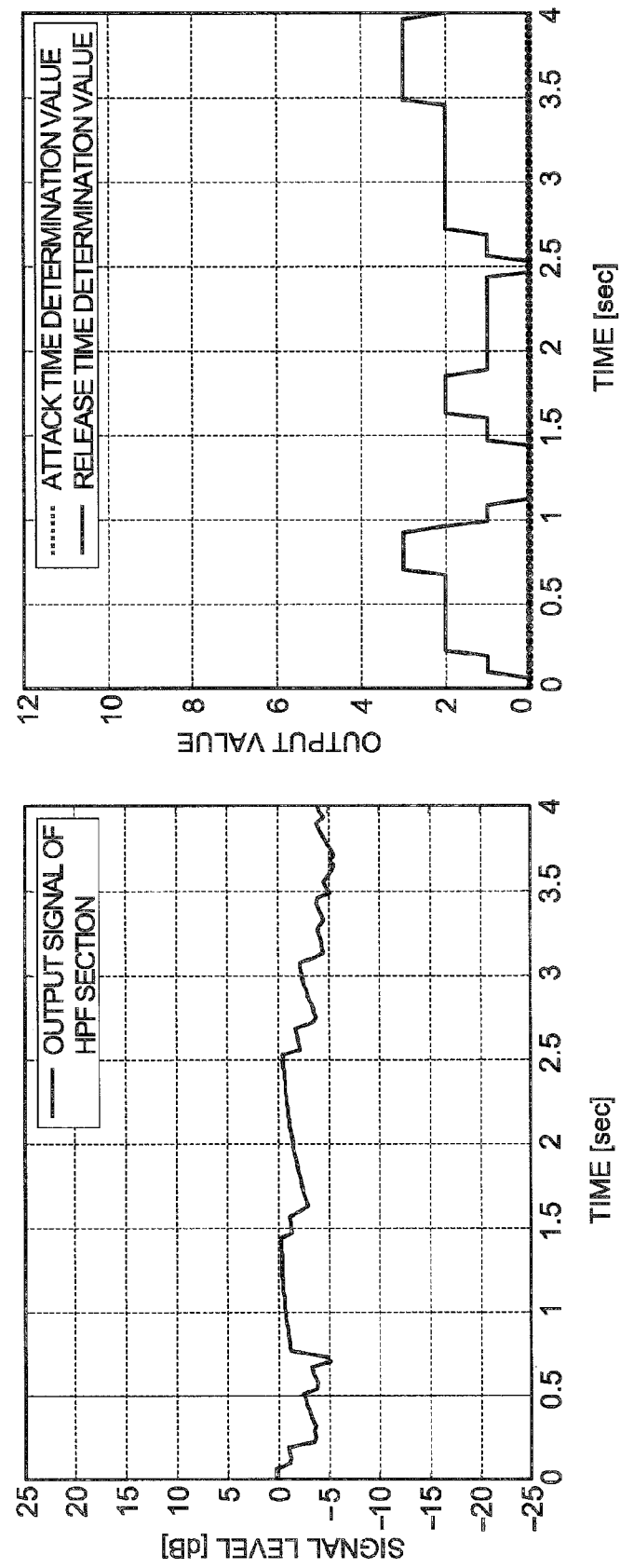
FIG. 7($a$) is a view illustrating a signal level variation state of an output signal of the HPF section in the case where an audio signal of a sound source is gradually faded out and the volume is gradually decreased.

FIG. 5(a), FIG. 6(a), and FIG. 7(a) are views each illustrating a state where the signal level of the output signal of the HPF section 23 is varied in accordance with a predetermined input signal, and FIG. 5(b), FIG. 6(b), and FIG. 7(b) are views each illustrating a variation state of the attack time determination value and variation state of the release time determination value.

In the examples of FIGS. 5 to 7, the level restriction in the level restricting section 21 is set in the range of −40 dB to 0 dB. The normalized cut-off frequency in the HPF section 23 is set to 0.1, which corresponds to about 1.5 Hz in the case where the sampling rate is 31.25 Hz. Further, the gain offset amount of the gain section 24 is set to the half (0.5) of the input signal, and the maximum holding time in the attack maximum value holding section 25 and release maximum value holding section 26 is set to 250 msec.

FIG. 5(a) illustrates a variation state of the output signal of the HPF section 23 as in the case of FIG. 3(b) where a sound source of an audio signal is switched to another sound source at time 1.9 sec and the volume is abruptly increased by 20 dB or more, and FIG. 5(b) illustrates a variation state of the attack time determination value and variation state of the release time determination value calculated based on the output of the HPF section 23 illustrated in FIG. 5(a).

As illustrated in FIG. 5(a), when a sound source of an input audio signal is switched to another sound source and the volume is abruptly increased, the output of the HPF section 23 is abruptly changed to exhibit a high value. In the case where the volume is abruptly changed in this way, the attack time determination value is increased in response to the output state of the HPF section 23, as illustrated in FIG. 5(b). On the other hand, the release time determination value is not largely changed as illustrated in FIG. 5(b) because the release time determination value is increased when the signal level is increased to the negative side.

Contrary to the case of FIG. 5(a), FIG. 6(a) illustrates a variation state of the output signal of the HPF section 23 in the case where a sound source of an input audio signal is switched to another sound source and the volume is abruptly decreased by about 20 dB, and FIG. 6(b) illustrates a variation state of the attack time determination value and variation state of the release time determination value calculated based on the output of the HPF section 23 illustrated in FIG. 6(a).

As illustrated in FIG. 6(a), when a sound source of an input audio signal is switched to another sound source and the volume is abruptly decreased, the output of the HPF section 23 is abruptly changed to exhibit a low value. In the case where the volume is abruptly changed in this way, the release time determination value is increased in response to the output state of the HPF section 23, as illustrated in FIG. 6(b) On the other hand, the attack time determination value is not largely changed in the case where the volume of an input audio signal is abruptly decreased because the attack time determination value is increased when the signal level is increased to the positive side.

FIG. 7(a) illustrates a variation state of the output signal of the HPF section 23 in the case where an input audio signal is gradually decreased in volume as the music comes to an end and gradually fades out, and FIG. 7(b) illustrates a variation state of the attack time determination value and variation state of the release time determination value calculated based on the output of the HPF section 23 illustrated in FIG. 7(a).

As illustrated in FIG. 7(b), when the volume of the input audio signal is gradually decreased, the attack time is not increased, and the release time determination value does not become so large.

[Dynamic Range Control Section]

The dynamic range control section 3 has a role of generating a control signal (dynamic range control signal, second control signal) for reducing a variation in the volume of a sound source based on the attack time determination value and release time determination value calculated by the attack/release time determination section 4.

Figure 8:
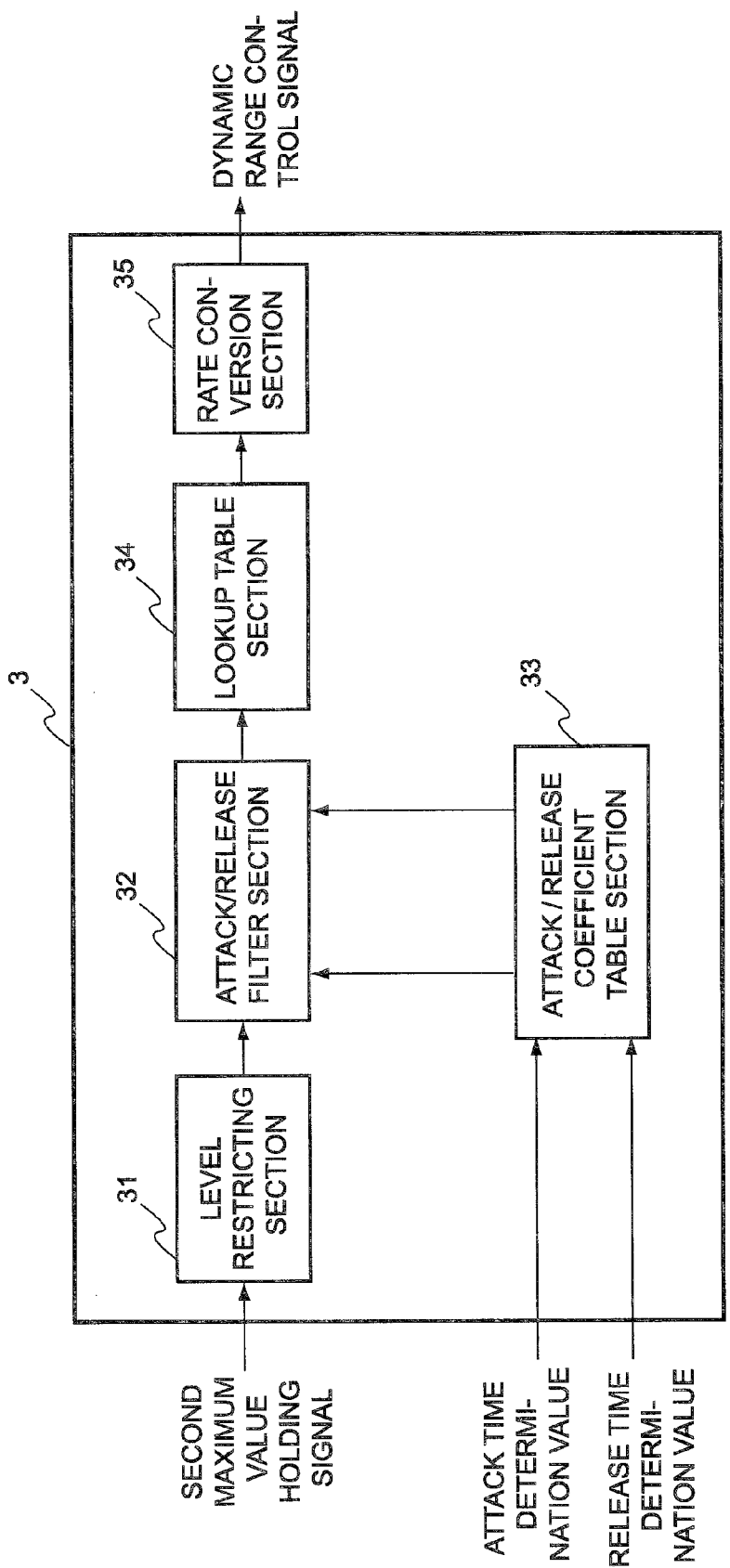
FIG. 8 is a block diagram schematically illustrating a configuration of a dynamic range control section according to the present embodiment.

As illustrated in FIG. 8, the dynamic range control section 3 includes a level restricting section 31, an attack/release filter section 32, an attack/release coefficient table section 33, a lookup table section 34, and a rate conversion section 35.

The level restricting section 31 restricts the input level of the second maximum value holding signal input from the level detection section 2.

The attack/release coefficient table section 33 selects a coefficient corresponding to the attack/release filter section 32 based on the attack time determination value and release time determination value input from the attack/release time determination section 4 and sets an attack time (correction time) and a release time (correction time) to be output to the attack/release filter section 32.

The attack/release filter section 32 applies filtering processing to the signal (second maximum value holding signal) that has been subjected to input level restriction by the level restricting section 31 so as to obtain a response speed corresponding to the attack time and release time acquired from the attack/release coefficient table section 33 to thereby smooth the signal.

Figure 9:
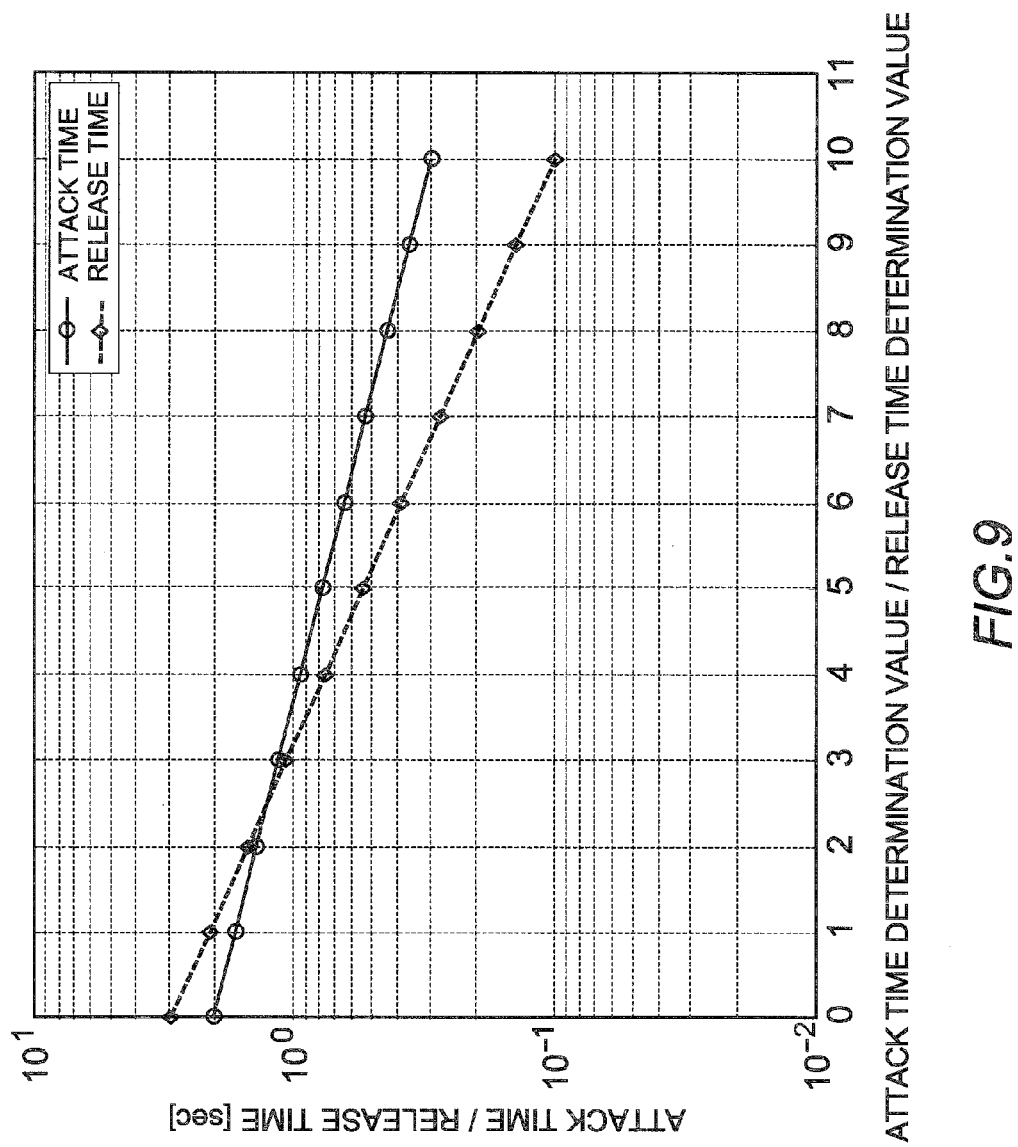
FIG. 9 is a graph illustrating the attack time set based on the attack time determination value in an attack/release coefficient table section according to the present embodiment and the release time set based on the release time determination value in the attack/release coefficient table section.

FIG. 9 is a graph illustrating the attack time set based on the attack time determination value in the attack/release coefficient table section 33 and the release time set based on the release time determination value in the attack/release coefficient table section 33. The attack/release coefficient table section 33 according to the present embodiment sets the attack time and release time based on the relationship represented by the graph of FIG. 9.

As illustrated in FIG. 9, the attack/release coefficient table section 33 sets an attack time value such that the attack time is reduced as the attack time determination value is increased. Further, the attack/release coefficient table section 33 sets a release time value such that the release time is reduced as the release time determination value is increased. When the attack time or release time that has been set to a reduced value is transmitted to the attack/release filter section 32, the attack/release filter section 32 applies the filtering processing to the second maximum value holding signal so as to obtain a response speed corresponding to the attack time or release time. Thus, the response processing is performed such that the larger a variation in the volume of a sound source, the shorter the time at which a variation in the volume is decreased, allowing correction processing for reducing a variation in the volume to be achieved at short times.

That is, in the case where the volume of a sound source is abruptly significantly changed to the positive side, the attack/release coefficient table section 33 reduces the attack time to increase the response speed of control for a reduction in a variation of the volume; while in the case where the volume of a sound source is slightly changed to the positive side, the attack/release coefficient table section 33 increases the attack time to reduce the response speed of control for a reduction in a variation of the volume. Further, in the case where the volume of a sound source is abruptly significantly changed to the negative side, the attack/release coefficient table section 33 reduces the release time to increase the response speed of control for a reduction in a variation of the volume; while in the case where the volume of a sound source is slightly changed to the negative side, the attack/release coefficient table section 33 increases the release time to reduce the response speed of control for a reduction in a variation of the volume.

Further, as illustrated in FIG. 9, a reduction (angle of inclination) of the release time is greater (angle inclination is steeper) than a reduction (angle of inclination) of the attack time, and the relational expressions of the attack time determination value and release time determination value cross each other at 2.5. Thus, in the case where a variation in the sound source is large (i.e., in the case where the attack time determination value and release time determination value is 2.5 or more), the setting time for the release time becomes smaller than that for the attack time, so that the response speed of control for a reduction in a variation of the volume changed to the negative side is increased. On the other hand, in the case where a variation in the sound source is small (i.e., in the case where the attack time determination value and release time determination value is less than 2.5), the setting time for the attack time becomes smaller than that for the release time, so that the response speed of control for a reduction in a variation of the volume changed to the positive side is increased.

The attack time and release time are set in this way. Thus, in the case where the volume of a sound source is abruptly increased as illustrated in FIG. 5, the attack time determination value is abruptly increased as illustrated in FIG. 5(b), and the attack time is set smaller in response to the increase of the attack time determination value, whereby processing for reducing the increased volume is performed rapidly. Further, in the case where the volume of a sound source is abruptly decreased as illustrated in FIG. 6, the release time determination value is abruptly increased as illustrated in FIG. 6(b), and the release time is set smaller in response to the increase of the release time determination value, whereby processing for restoring the decreased volume is performed rapidly. Further, in the case where the volume of a sound source is gradually decreased as illustrated in FIG. 7, the release time determination value is not increased much as illustrated in FIG. 7(b), so that the release time is not set small, and the control processing corresponding to a variation in the volume is performed slowly.

The attack/release coefficient table section 33 sets the attack time and release time in this way, allowing the speed of processing for reducing a variation in the volume to be varied in accordance with the variation in the sound source. Further, the volume control for achieving optimum value can be performed irrespective of whether the volume is abruptly changed or gradually changed.

Figure 10B:
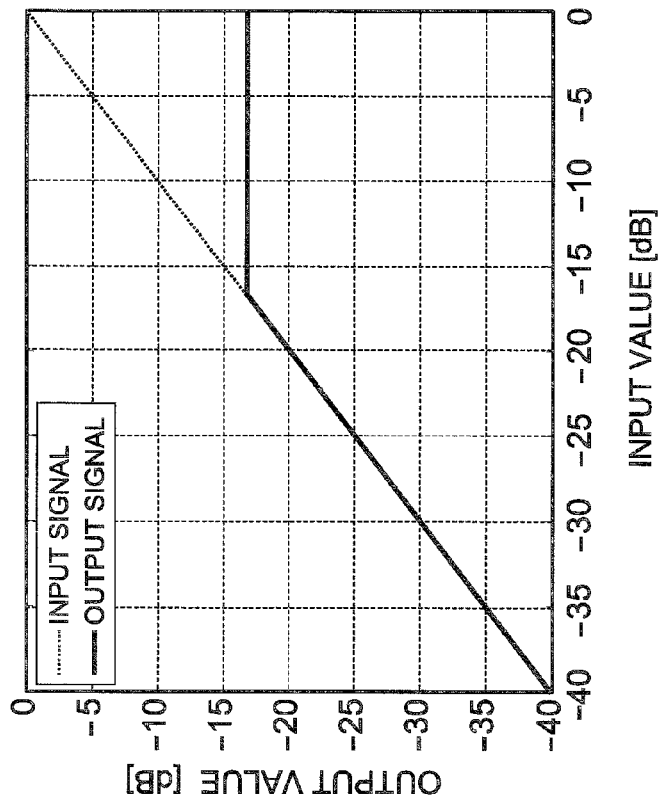
FIG. 10($a$) is a view illustrating level conversion characteristics in a lookup table section of a dynamic range control section according to the present embodiment.
Figure 10A:
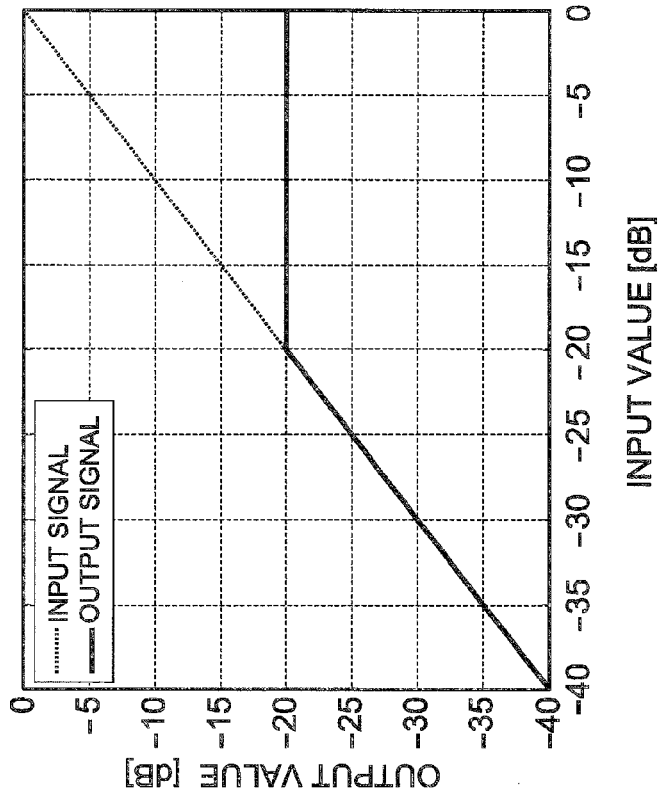

The lookup table section 34 performs signal level conversion of a signal that has been smoothed through the filtering processing performed in the attack/release filter section 32. FIG. 10(a) illustrates level conversion characteristics in the lookup table section 34. As illustrated in FIG. 10(a), a signal of a level higher than −20 dB input to the lookup table section 34 is level-converted in the lookup table section 34 such that the output level is suppressed to −20 dB, and the resultant signal is output to the rate conversion section 35.

FIG. 11 illustrates output signals of the attack/release filter section 32 and lookup table section 34 as in the case of FIG. 5 where the volume of a sound source is abruptly increased. As illustrated in FIG. 11, in the case where the volume of a sound source is abruptly increased, the attack/release filter section 32 performs processing of rapidly decreasing the volume in response to the increase in the volume (immediately at the volume increase time (1.9 sec) as illustrated in FIG. 5) and, after that, the lookup table section 34 generates a control signal for reducing the volume level of a sound source by about 15 dB.

The rate conversion section 35 converts the sampling rate of the signal that has been level-converted in the lookup table section 34 and adjusts the control timing of the sampling rate converted signal so as to allow the sampling rate converted signal to have the same sampling as that of the first maximum value holding signal. The signal that has been subjected to the sampling rate conversion and the control timing adjustment is output to the limiter control section 5 as a dynamic range control signal.

[Limiter Control Section]

The limiter control section 5 has a role of compensating volume control that could not be achieved completely in the dynamic range control section 3.

As illustrated in FIG. 12, the limiter control section 5 includes a level restricting section (first control signal generation section) 41, an attack/release filter section (first control signal generation section) 42, a lookup table section (first control signal generation section) 43, a first multiplier 44, a second multiplier (limiter control signal generation section) 45, and a rate conversion section 46.

The level restricting section 41 restricts the signal level of an input signal. The attack/release filter section 42 applies filtering processing to the signal that has been subjected to the signal level restriction by the level restricting section 41 at a response speed corresponding to the previously set attack time and release time to thereby smooth the signal. Although this processing generates a control delay with respect to the input signal L and input signal R of a sound source, the delay time is corrected by the limiter delay correction section 6.

The lookup table section 43 performs signal level conversion of a signal that has been smoothed through the filtering processing performed in the attack/release filter section 42. FIG. 10(b) illustrates level conversion characteristics in the lookup table section 43. As illustrated in FIG. 10(b), an input signal of a level higher than –17 dB is level-converted in the lookup table section 43 such that the output level is suppressed to –17 dB, and the resultant signal is output to the second multiplier 45.

The first multiplier 44 multiplies the dynamic rage control signal and first maximum value holding signal and outputs the resultant signal to the level restricting section 41. The second multiplier 45 multiplies the dynamic range control signal and output signal of the lookup table section 43 and outputs the resultant signal to the rate conversion section 46. As described above, in the second multiplier 45, the dynamic range control signal for which the volume control (dynamic range control) of a sound source based on the long-term variation of the maximum value can be performed is added to the signal for which the volume control (limiter control) of a sound source based on the short-term variation of the maximum value can be performed based on the processing performed by the level restricting section 41, attack/release filter section 42, and lookup table section 43.

The rate conversion section 46 converts the sampling rate of an input signal, adjusts the control timing of the sampling rate converted signal so as to allow the sampling rate converted signal to have the same sampling as that of the audio signal, and applies smoothing to the resultant signal. The control signal that has been subjected to the smoothing processing by the rate conversion section 46 is output to the first multiplier 7 and second multiplier 8 illustrated in FIG. 1 as a limiter control signal.

As described above, the limiter control section 5 applies the limiter control to the dynamic control signal that has been subjected to the dynamic range control to thereby enable volume control processing using a single control signal. The generation of the control signal (limiter control signal) having both the control characteristics in the limiter control section 5 allows a simplification of signal processing in the acoustic processing device 1 and a reduction in processing load therein.

FIG. 13 illustrates a time variation of the output signal of the first multiplier 44 as in the case of FIG. 5 where the volume of a sound source is abruptly increased by 20 dB or more, and FIG. 14 illustrates a time variation of the output signals of the attack/release filter section 42 and lookup table section 43 in the case where the volume of a sound source is abruptly increased by 20 dB or more.

In the examples of FIGS. 13 and 14, the level restriction in the level restricting section 41 is set in the range of –17 dB to 0 dB, and the attack time and release time are set to 5 msec, respectively.

As described above, the first multiplier 44 multiplies the first maximum value holding signal and dynamic range control signal. Thus, the output signal of the first multiplier 44 illustrated in FIG. 13 corresponds to a signal (first maximum value holding signal) of a sound source that has been subjected to the dynamic range control. The dynamic range control is performed slowly in general, so that, as illustrated in FIG. 13, a response delay occurs in a signal obtained by applying only the dynamic range control to an audio signal of a sound source in response to the abrupt increase in the volume, and the signal level is increased by 20 dB or more around 1.9 sec. In order to cope with this, as illustrated in FIG. 14, in the limiter control section 5, the attack/release filter section 42 responds in a moment to the increase of the volume of a sound source, and lookup table section 43 generates a control signal for decreasing the volume level of a sound source by a maximum of about 13 dB.

The limiter control signals output from the limiter control section 5 to the first and second multipliers 7 and 8 are multiplied by the input signals L and R of a sound source that have been subjected to the delay correction by the limiter delay correction section 6, respectively. This allows application of volume control processing (acoustic processing) corresponding to a variation of the volume of the input and output signals L and R, more particularly, processing in which the dynamic range control in the dynamic range control section 3 and limiter control in the limiter control section 5 are combined to the input signals L and R based on the limiter control signal. By performing such volume control processing, it is possible to enjoy audio sound with satisfactory volume while maintaining the volume level that a listener has set in the volume setting section 9 even when a sound source is switched to another sound source to cause the volume to be abruptly changed.

FIG. 15(a) illustrates a variation state of the volume of a sound source in the case where the volume control in the acoustic processing device 1 is not performed, and FIG. 15(b) illustrates a variation state of the volume of a sound source in the case where the volume control in the acoustic processing device 1 is performed. As illustrated in FIG. 15(a), in the case where a sound source is switched to another sound source at time A, the volume of the sound source is abruptly decreased if the volume control is not performed with the result that a satisfactory volume level cannot be maintained. Further, in the case where the sound source is changed back to the original source after (time B) the listener has manually performed the volume control, the volume of the sound source is abruptly increased. Thus, the volume of the sound source is changed to an unexpected level with the result that a satisfactory volume level cannot be maintained.

On the other hand, in the case where the volume control in the acoustic processing device 1 is performed, even if a sound source is changed to another sound source at time A and time B and thereby the volume of the sound source is changed, the slow dynamic range control by the dynamic range control section 3 and high-speed limiter control by the limiter control section 5 are used in combination to achieve the volume control for reducing a variation in the sound level. Further, a control signal in which the dynamic range control and limiter control are combined is used to apply the volume correction processing to an input signal of a sound source, so that signal processing can be simplified. Further, in the case where the volume control is performed using the acoustic processing device 1, the control speed can be changed in accordance with a variation of the volume of a sound source in the dynamic range control by the dynamic range control section 3, so that the optimum volume correction control can be performed in accordance with the characteristics of the sound source.

As described above, in the acoustic processing device 1 according to the present embodiment, the level detection section 2 calculates the first maximum value holding signal detecting a variation state of the volume of an input signal input from a sound source at a long time interval and second maximum value holding signal detecting a variation state of the volume of an input signal input from a sound source at a short time interval. Thus, by performing the volume control processing based on the first maximum value holding signal, it is possible to perform rapidly responding volume control processing for a variation in the volume. Further, by performing the volume control processing (dynamic range control) based on the second maximum value holding signal, it is possible to perform slowly responding volume control processing for a variation in the volume.

Further, in the acoustic processing device 1 according to the present embodiment, the attack/release time determination section 4 sets determination values (attack time determination value and release time determination value) for determining the processing time of acoustic processing based on a variation in the second maximum holding signal, and the dynamic range control section 3 performs the volume correction processing at a response speed corresponding to the processing time (attack time and release time) calculated based on the set determination values.

Thus, in the case where a variation in the second maximum value holding signal is large, the response time of the control processing is set smaller to thereby achieve rapid volume correction processing. In the case where the variation is small, the response speed is set larger to thereby achieve slow volume correction processing. Therefore, in the case where a variation in the volume of a sound source is abrupt and large, volume control for reducing the variation can rapidly be performed in accordance with the variation. In the case where a variation in the volume of a sound source is small, volume control for reducing the variation can slowly be performed.

Further, the limiter control section 5 can generate a control signal concerning rapid volume correction processing (limiter control processing) based on the second maximum value holding signal detecting a maximum value at a short time interval. Further, volume correction processing concerning the slow volume correction processing (dynamic range control) performed in the dynamic range control section 3 based on the first maximum value holding signal detecting a maximum value at a long time interval can be applied to the control signal. Thus, a control signal that has been subjected to both the rapid volume correction processing and slow volume correction processing can be applied to an input signal of a sound source in a single processing step, thereby simplifying signal processing as compared to a case where a control signal that has been subjected to rapid volume correction processing and a control signal that has been subjected to slow volume correction processing are individually generated and individually applied to an input signal of a sound source.

Further, a control signal that has been subjected to both the rapid volume correction processing and slow volume correction processing can be applied to an input signal of a sound source in a single processing step, thereby simplifying the hardware configuration of the acoustic processing device 1 as compared to a case where a control signal that has been subjected to rapid volume correction processing and a control signal that has been subjected to slow volume correction processing are individually applied to an input signal of a sound source. Further, when signal processing concerning the volume correction processing is performed in the limiter control section 5, it is possible to perform the processing using a sampling rate lower than that of an input signal of a sound source. Thus, it is possible to reduce the processing power required for the acoustic processing device 1 to thereby reduce hardware resources required for the processing device.

Although the present invention has been shown and described with reference to the accompanying drawings, the acoustic processing device of the present invention is not limited to the above embodiment. It will be apparent to those having ordinary skill in the art that a number of modifications or alternations to the invention as described herein may be made, none of which depart from the spirit of the present invention. All such modifications and alternations should therefore be seen as within the scope of the present invention.

Reference Sings List
1 acoustic processing device
2 level detection section (level signal generation section)
3 dynamic range control section (second control signal generation section, dynamic range signal generation section)
4 attack/release time determination section (second control signal generation section, correction time information setting section)
5 limiter control section (first control signal generation section, limiter control signal generation section)
6 limiter delay correction section
7 first multiplier (of acoustic processing device), (volume control section)
8 second multiplier (of acoustic processing device), (volume control section)
9 volume setting section
11 BPF section (of level detection section)
12 first maximum value detection section (of level detection section)
13 second maximum value detection section (of level detection section)
14 first maximum value holding section (of level detection section)
15 second maximum value holding section (of level detection section)

21 level restricting section (of attack/release time determination section)
22 decibel conversion section (of attack/release time determination section)
23 HPF section (of attack/release time determination section)
24 gain section (of attack/release time determination section)
25 attack maximum value holding section (of attack/release time determination section)
26 release maximum value holding section (of attack/release time determination section)
31 level restricting section (of dynamic range control section)
32 attack/release filter section (of dynamic range control section)
33 attack/release coefficient table section (of dynamic range control section)
34 lookup table section (of dynamic range control section)
35 rate conversion section (of dynamic range control section)
41 level restricting section (of limiter control section), (first control signal generation section)
42 attack/release filter section (of limiter control section), (first control signal generation section)
43 lookup table section (of limiter control section), (first control signal generation section)
44 first multiplier (of limiter control section)
45 second multiplier (of limiter control section), (limiter control signal generation section)
46 rate conversion section (of limiter control section)

The invention claimed is:

1. An acoustic processing device comprising:
a level signal generation section configured to generate
    a first variation signal representing a short-term signal level variation by holding, for a short hold period of time, a maximum value detected at a short time interval in an audio signal input from a sound source, and
    a second variation signal representing a long-term signal level variation by holding, for a long hold period of time longer than the short hold period of time, a maximum value detected at a long time interval longer than the short time interval in the audio signal;
a first control signal generation section configured to generate, based on the signal level variation in the first variation signal, a first control signal for performing rapid variation correction for the signal level of the audio signal;
a second control signal generation section configured to generate, based on the signal level variation in the second variation signal, a second control signal for performing slow variation correction for the signal level of the audio signal;
a limiter control signal generation section configured to multiply the second control signal generated by the second control signal generation section and the first control signal generated by the first control signal generation section to generate a limiter control signal capable of applying the rapid variation correction and slow variation correction to the signal level of the audio signal; and
a volume control section configured to perform volume control of the audio signal by applying the limiter control signal to the audio signal,
wherein the second control signal generation section includes:
    a correction time information setting section configured to set information concerning correction time for performing the variation correction based on a variation state of the signal level of the second variation signal; and
    a dynamic range signal generation section configured to calculate correction time based on information concerning the correction time and generates the second control signal capable of performing variation correction for the audio signal at a response speed corresponding to the calculated correction time.

2. The acoustic processing device according to claim 1, wherein
the correction time information setting section sets information for reducing the correction time in the case where the signal level of the second variation signal is abruptly changed and sets information for increasing the correction time in the case where the signal level of the second variation signal is slowly changed.

* * * * *